US 11,440,310 B2

(12) United States Patent
Klein et al.

(10) Patent No.: US 11,440,310 B2
(45) Date of Patent: Sep. 13, 2022

(54) METHOD FOR PRODUCING A SUBSTRATE ADAPTER AND SUBSTRATE ADAPTER FOR CONNECTING TO AN ELECTRONIC COMPONENT

(71) Applicant: Heraeus Deutschland GmbH & Co. KG, Hanau (DE)

(72) Inventors: Andreas Steffen Klein, Hanau (DE);
Andreas Hinrich, Hanau (DE);
Michael Schaefer, Hanau (DE);
Yvonne Loewer, Hanau (DE);
Wolfgang Schmitt, Hanau (DE);
Michael Lemmer, Hanau (DE)

(73) Assignee: Heraeus Deutschland GmbH & Co. KG, Hanau (DE)

( * ) Notice: Subject to any disclaimer, the term of this patent is extended or adjusted under 35 U.S.C. 154(b) by 16 days.

(21) Appl. No.: 16/704,145

(22) Filed: Dec. 5, 2019

(65) Prior Publication Data

US 2020/0180294 A1  Jun. 11, 2020

(30) Foreign Application Priority Data

Dec. 6, 2018  (DE) .................. 10 2018 221 148.5

(51) Int. Cl.
| | |
|---|---|
| *B29C 65/00* | (2006.01) |
| *B32B 43/00* | (2006.01) |
| *H05K 3/00* | (2006.01) |
| *B29C 65/76* | (2006.01) |

(52) U.S. Cl.
CPC ........... *B32B 43/006* (2013.01); *H05K 3/007* (2013.01); *B29C 65/76* (2013.01); *B29C 66/02* (2013.01); *B29C 66/022* (2013.01); *B29C 66/0222* (2013.01); *B29C 66/43* (2013.01)

(58) Field of Classification Search
CPC ....... B29C 65/76; B29C 66/02; B29C 66/022; B29C 66/0222; B29C 66/43
See application file for complete search history.

(56) References Cited

U.S. PATENT DOCUMENTS

| | | |
|---|---|---|
| 8,105,462 B2 | 1/2012 | Konishi |
| 8,691,666 B2 | 4/2014 | Segawa et al. |
| 9,196,520 B1 * | 11/2015 | Sanchez .............. H01L 21/6836 |
| 10,622,331 B2 | 4/2020 | Hinrich et al. |
| 2007/0013067 A1 | 1/2007 | Nishida et al. |
| 2014/0234649 A1 | 8/2014 | Kalich et al. |
| 2018/0286831 A1 | 10/2018 | Hinrich et al. |

FOREIGN PATENT DOCUMENTS

| | | |
|---|---|---|
| DE | 10 2009 018 541 A1 | 10/2010 |
| DE | 10 2011 083 926 A1 | 4/2013 |
| EP | 2144283 | 1/2020 |
| JP | 2018/530166 | 10/2018 |
| KR | 20180059913 | 6/2018 |

\* cited by examiner

*Primary Examiner* — Philip C Tucker
*Assistant Examiner* — Nickolas R Harm
(74) *Attorney, Agent, or Firm* — Dicke, Billig & Czaja, PLLC

(57) ABSTRACT

One aspect relates to a method for producing a substrate adapter for the connecting to an electronic component, including arranging at least one contacting material layer between at least one side of a carrier and a surface of a substrate such that the contacting material layer has at least one predetermined breaking point, and joining the carrier and the substrate to the contacting material layer. One aspect also relates to a substrate adapter for connecting to an electronic component.

12 Claims, 3 Drawing Sheets

METHOD FOR PRODUCING A SUBSTRATE ADAPTER AND SUBSTRATE ADAPTER FOR CONNECTING TO AN ELECTRONIC COMPONENT

CROSS-REFERENCE TO RELATED APPLICATION

This Utility Patent Application claims priority to German Application No. 10 2018 221 148.5 filed on Dec. 6, 2018, which is incorporated herein by reference.

TECHNICAL FIELD

The present invention relates to a method for producing a substrate adapter. Furthermore, the present invention relates to a substrate adapter for connecting to an electronic component.

BACKGROUND

Substrate adapters are known in the prior art and are used in power electronics. These substrate adapters are usually configured as composite materials, comprising a contacting material in the form of a porous or brittle layer, such as a sinterable layer or an adhesive layer. This porous or sinterable layer, as is known in the prior art, is at first placed on a substrate or a carrier, such as a carrier film, and then these layers are joined to form a layered composite. In DE 10 2011 083 926 A1, for example, a layered composite made from a carrier film and a layer arrangement comprising a porous or sinterable layer and a solder layer is described. The porous or sinterable layer can be joined to electronic components or electronic parts in order to make possible improved connections between different electronic components. In such a method, the layered arrangement is lifted off from the carrier film and the porous or sinterable layer is placed on the electronic component.

Furthermore, DE 10 2009 018 541 A1 describes a contacting agent for electronic components with a porous or sinterable layer having printed metallic connection structures.

However, the solutions known in the prior art have the drawback that the detachment of the porous or sinterable layers may result in uncontrolled breakages within the layers. Furthermore, the uncontrolled breakage has negative effects on the production yield and the product quality of the resulting product, since rejects are produced or defective parts are further processed.

SUMMARY

One aspect of the present embodiments provides an improved method for producing of a substrate adapter and a substrate adapter which overcomes the drawbacks of the prior art. One embodiment prevents a breakage of the contacting material layer, so that the detaching of the parts can be done in reproducible manner with equal quality, so as to make possible a robust component mounting process and a high production yield.

In one embodiment, a method for producing a substrate adapter for the connecting to an electronic component, includes arranging at least one contacting material layer between at least one side of a carrier and a surface of a substrate such that the contacting material layer has at least one predetermined breaking point, and joining the carrier and the substrate to the contacting material layer.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1A:
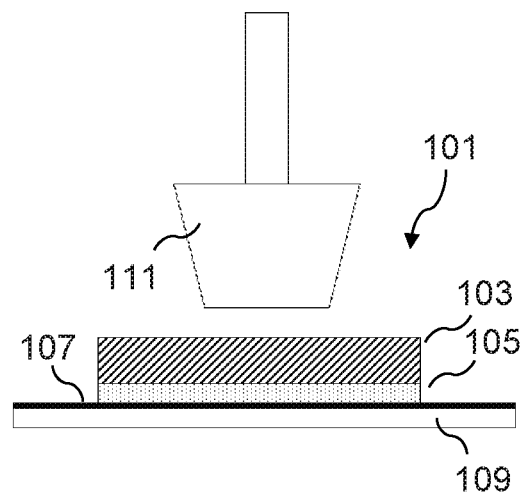
FIGS. 1a-d illustrate schematic cross sectional views of a substrate adapter known from the prior art.

In the following Detailed Description, reference is made to the accompanying drawings, which form a part hereof, and in which is illustrated by way of illustration specific embodiments in which one embodiments may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present embodiments. The following detailed description, therefore, is not to be taken in a limiting sense, and the scope of the present embodiments are defined by the appended claims.

It is to be understood that the features of the various exemplary embodiments described herein may be combined with each other, unless specifically noted otherwise.

In the following, the same reference numbers will be used for the same or equivalent parts.

A method according to one embodiment for producing a substrate adapter for connecting to an electronic component includes arranging at least one contacting material layer between at least one side of a carrier and a surface of a substrate such that the contacting material layer has at least one predetermined breaking point, and joining the carrier and the substrate to the contacting material layer.

The substrate may be a metal sheet or a metal band segment, especially a copper sheet or a copper band segment. By a copper sheet is also meant a sheet consisting of a copper alloy material. A copper band segment may also be a band segment consisting of a copper alloy material. Furthermore, it is possible for the substrate to be a leadframe or a DCB substrate or a PCB substrate. In one embodiment, the metal sheet or the metal band segment, especially the copper sheet or the copper band segment, is not pre-structured. Merely a cutting to length and/or a structuring of the side edges can be done for the substrate being used.

The substrate may be coated on at least one side, especially with a material comprising gold (Au) or nickel-gold (NiAu) or silver (Ag) or nickel-silver (NiAg) or nickelpalladium-gold (NiPdAu), in particular galvanized. Furthermore, it is possible for the material to be chemically deposited on at least one side of the substrate. In one embodiment, the substrate is coated at least on one side, which will afterwards form the contact, especially with the mentioned materials. It is moreover conceivable that both sides of the substrate are coated for example with the aforementioned materials.

The contacting material layer, which may be a sinter paste, especially a silver-containing sinter paste, or a solder or a conductive adhesive or an adhesive film, serves for the actual connecting of the substrate to the electronic component.

The carrier can be, for example, a carrier film, especially a carrier film with slight adhesion force. Furthermore, it is possible to stretch UV tape over a wafer frame in order to produce a carrier. The substrate provided with a layer of the contacting material can be glued to this UV tape. Alternatively, the contacting material layer may also be deposited on the carrier and the substrate arranged on the contacting material layer. The carrier serves for transporting the substrate adapter from a first production facility to a further production facility or from a first manufacturing device to a second manufacturing device.

According to one embodiment, the contacting material layer has at least one predetermined breaking point. By a "predetermined breaking point" is meant in this context a region in or on the contacting material layer which fails in targeted and predictable manner under excessive loading and thereby separates the contacting material layer in controlled manner along this predetermined breaking point. This predetermined breaking point may be situated in a face or in a face segment in the contacting material layer, in particular one extending parallel to the surface of the substrate.

The predetermined breaking point may be formed for example from material recesses in a face of the contacting material layer or by introducing a separating layer into the contacting material layer, especially a two-dimensional introducing of such a layer, for example one which is produced in the physical vapor deposition (PVD) method.

For the first time, one embodiment has succeeded in greatly reducing or preventing uncontrolled breakage inside the contacting material layer upon detachment from the carrier. Advantageously, the production yield and the product quality of the resulting product can be increased in this way, since neither rejects are produced nor are defective pieces further processed.

In one example, the arranging of the contacting material layer involves:
arranging the contacting material layer with at least one material recess in the contacting material layer, in one embodiment a plurality of material recesses, in order to form the predetermined breaking point, in particular, wherein the material recesses are situated on a surface of the contacting material layer and/or face toward the carrier.

The material recesses can be formed by a region in the contacting material layer which runs substantially parallel to the substrate and having less than 50% of the contacting material arranged in its two-dimensional extension. Furthermore, the region may be formed with the material recesses formed on a surface of the contacting material layer facing toward the carrier, so that the carrier is not fully covered by the contacting material layer.

In one example, the arranging of the contacting material layer involves:
arranging the contacting material layer at least for a portion in the form of three-dimensional structures, especially in the form of pyramid-shaped, sphere-shaped, cube-shaped, torus-shaped, cylinder-shaped, and/or cone-shaped structures, wherein the material recess, in one embodiment the material recesses, is/are formed of at least one space between adjacent three-dimensional structures.

For example, a first portion of the contacting material layer can be provided in the form of a substantially flat layer and a second portion of the contacting material layer can be arranged on this layer in the form of the above described three-dimensional structures.

In one example, the arranging of the contacting material layer involves:
arranging, in particular evenly spaced arranging, of the three-dimensional structures along a first axis of extension, in one embodiment along the first axis of extension and a second axis of extension, especially wherein the first and the second axis of extension are situated at an angle of substantially 90° to each other.

In one embodiment, the three-dimensional structures are distributed evenly over the surface of the layer of contacting material so as to make possible a uniform and controlled detachment of the contacting material layer from the carrier.

In a further example, the arranging of the contacting material layer involves:
arranging the contacting material layer on the carrier by pressing, especially by silk screening, spraying on, and/or doctor blading, and/or
arranging the contacting material layer on the carrier by embossing, especially by embossing with a stamp and/or a profiled roller.

In this example, a substantially uniform layer of the contacting material can first be printed on the carrier or on the substrate and then three-dimensional structures to realize the predetermined breaking point can be printed on the layer or formed in the layer by means of a profiling roller.

The contacting material layer is in one embodiment applied to the carrier or to the substrate over the entire surface or almost the entire surface. For example, at least one substrate can be positioned in a print nest for applying the contacting material layer. It is possible to position multiple substrates in a print nest. Furthermore, it is possible to apply the contacting material for forming a contacting material layer by a spraying process. However, an application by means of a doctor blading process is also possible.

In one example, the carrier includes at least one adhesive layer, especially an adhesive layer with a substantially constant adhesive force over the surface of the carrier.

Advantageously, the three-dimensional structures of the predetermined breaking point and be connected especially reliably to the carrier in this way and thus will not slip during transport of the arrangement between different production facilities. Furthermore, the adhesive layer advantageously supports a controlled detachment of the contacting material layer from the carrier.

In yet another example, the contacting material layer includes an adhesive, a solder and/or a sinter material, especially a sinter paste and/or a sinter foil, comprising in one embodiment silver, a silver alloy, copper, and/or a copper alloy.

In one example, the method involves:
detaching the substrate adapter, especially with a gripping or suctioning device, substantially along the predetermined breaking point between the contacting material layer and the carrier.

The detachment of the substrate together with the applied contacting material layer from the carrier can be done with the aid of a nozzle. In the context of a pick-and-place process, the substrate together with the applied contacting material layer can be loosened from the carrier along the predetermined breaking point and be applied to the electronic component. This can be done in a single step, i.e., after the detaching from the carrier the substrate can be placed at once on the electronic component. Furthermore, it is possible for the detaching from the carrier and the placing of the substrate together with the contacting material layer on the electronic component to be done in two separate steps and thus possibly with two different nozzles.

The electronic component may be a semiconductor or a DCB substrate or a PCB substrate. The connecting of the substrate arrangement to the electronic component can be done for example by means of sintering and/or pressing together and/or gluing. In other words, the substrate arrangement is sintered and/or pressed and/or soldered and/or glued to the electronic component. In one embodiment, the substrate arrangement is sintered to the electronic component.

In a further example, the method involves:
separating the substrate and the carrier joined to the contacting material layer after the joining of the carrier and the substrate to the contacting material layer, especially subdividing, prior to the detaching of the substrate joined to the contacting material layer, into at least two shaped parts of the substrate joined to parts of the contacting material layer, especially into a plurality of shaped parts by means of sawing, slicing, stamping, and/or etching.

After the joining of the carrier and the substrate to the contacting material layer, the substrate can be separated.

Furthermore, it is possible to produce multiple substrate arrangements from a larger substrate arrangement by singulation. It is also possible to structurize the substrate, for example, in order to adapt the substrate or the substrate arrangement to the geometry of the component being connected.

In one embodiment, the separation of the side margin and/or the structurizing of the substrate and/or the singulation of the substrate is done by means of laser. With the aid of a laser cutting method, extremely small components can be machined. Furthermore, very sharp edges can be created with the aid of a laser cutting method.

During the separating of the side margin and/or during the structurizing of the substrate and/or during the singulation of the substrate, especially in a condition of the substrate connected to the carrier, the contacting material layer can be separated and/or structurized and/or singulated at least for a portion.

In one example, the substrate includes a metal element, in one embodiment a metal foil, in one further embodiment a copper foil.

One embodiment also proposes a substrate adapter for connecting to an electronic component, comprising:
a carrier; a substrate, and
a layer of contacting agent, wherein the contacting material layer is arranged between at least one side of the carrier and a surface of the substrate, wherein the contacting material layer has at least one predetermined breaking point, and the carrier and the substrate are joined to the contacting material layer.

In one example, the contacting material layer includes at least one material recess in the contacting material layer, in one embodiment a plurality of material recesses, in order to form the predetermined breaking point, in particular the material recess is situated on a surface of the contacting material layer and/or faces toward the carrier.

In a further example, the contacting material layer is arranged at least for a portion in the form of three-dimensional structures, especially in the form of pyramid-shaped, sphere-shaped, cube-shaped, torus-shaped, cylinder-shaped, and/or cone-shaped structures, wherein the material recess, in one embodiment the material recesses, is/are formed of at least one space between adjacent three-dimensional structures.

In one example, the three-dimensional structures are arranged, in particular evenly spaced, along a first axis of extension, in one embodiment along the first axis of extension and a second axis of extension, especially wherein the first and the second axis of extension are situated at an angle of substantially 90° to each other.

In yet another example, the carrier includes at least one adhesive layer, especially an adhesive layer with a substantially constant adhesive force over the surface of the carrier, and/or the contacting material layer includes an adhesive, a solder and/or a sinter material, especially a sinter paste and/or a sinter foil, comprising in one embodiment silver, a silver alloy, copper, and/or a copper alloy Further features and benefits of the embodiments will emerge from the following description, in which embodiments are explained with the aid of schematic drawings.

FIGS. 1a-d show schematic cross sectional views of a substrate adapter 101 known from the prior art. As is illustrated in FIG. 1a, the substrate adapter 101 includes a contacting material layer 105, which is arranged between one side of a carrier 109 and a surface of a substrate 103. The substrate adapter 101 illustrated in FIGS. 1a-d additionally includes an adhesive layer 107, which is arranged on the carrier 109 between the carrier 109 and the contacting material layer 105.

FIG. 1a further illustrates a nozzle 111 for detaching the substrate 103 together with the applied contacting material layer 105 from the carrier 109 during a pick-and-place process.

Figure 1B:
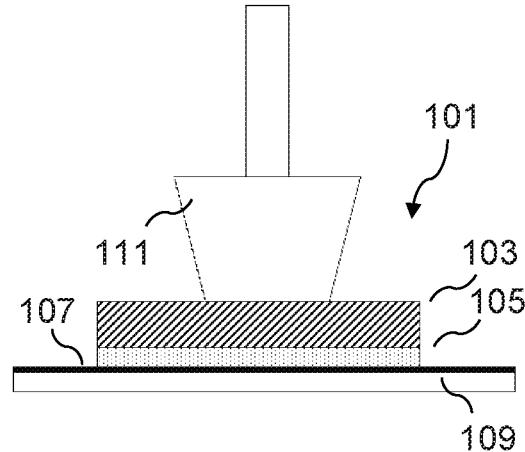
Figure 1C:
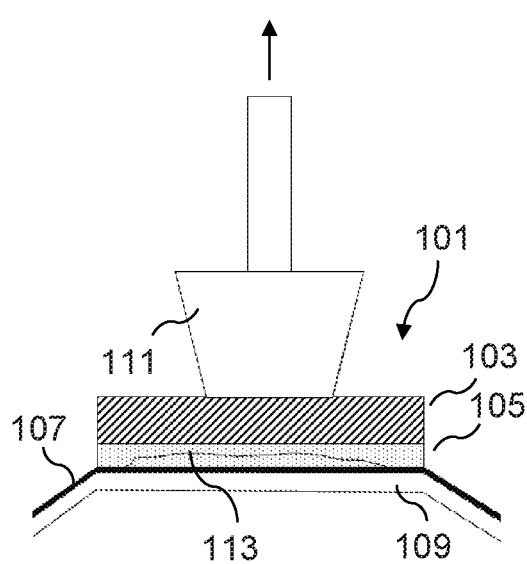
Figure 1D:
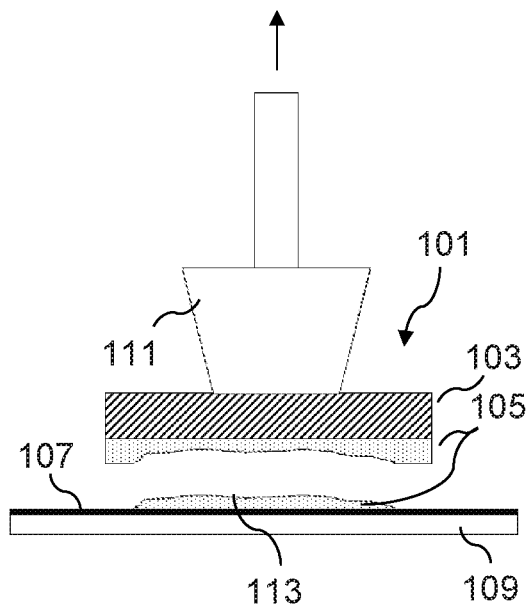

In FIG. 1b, the nozzle 111 is in contact with a surface of the substrate 103 which faces away from the contacting material layer 105. By means of a vacuum, the substrate 103 is now loosened from the carrier 109, as illustrated in FIG. 1c. The arrow above the nozzle 111 illustrates the direction of movement. By the lifting off or detaching of the substrate 103 with the contacting material layer 105 arranged thereon, it may happen in the case of the method or the substrate adapter 101 known in the prior art that uncontrolled breakage may occur within the contacting material layer 105 during the detachment of the mostly porous contacting material layer 105. This is illustrated in FIG. 1c by a fracture line 113 in the material of the contacting material layer 105. FIG. 1d illustrates the substrate 103 detached from the carrier 109 with the broken-off contacting material layer 105.

The uncontrolled breakage generally has negative effect on the production yield and the product quality of the resulting product, since rejects occur and/or defective parts are further processed.

FIGS. 2a-d show schematic cross sectional views of a substrate adapter 1 according to one embodiment.

Figure 2A:
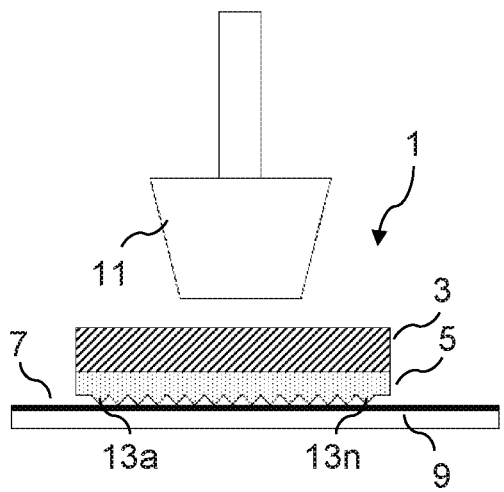
FIGS. 2a-d illustrate schematic cross sectional views of a substrate adapter according to one embodiment.

The substrate adapter 1 illustrated in FIG. 2a also includes a contacting material layer 5, which is arranged between one side of a carrier 9 and a surface of a substrate 3.

The contacting material layer 5 may include an adhesive, a solder, and/or a sinter material, especially a sinter paste and/or a sinter foil, in one embodiment comprising silver, a silver alloy, copper, and/or a copper alloy. The substrate 3 may be a metal sheet or a metal band segment, especially a copper sheet or a copper band segment. By a copper sheet is also meant a sheet consisting of a copper alloy material. A copper band segment may also be a band segment consisting of a copper alloy material. Furthermore, it is possible for the substrate 3 to be a leadframe or a DCB substrate or a PCB substrate. The carrier 9 can be a carrier film, especially a carrier film with slight adhesion force. Furthermore, it is possible to stretch UV tape over a wafer frame in order to produce a carrier 9. The substrate 3 provided with the contacting material layer 5 can be glued to this UV tape.

In the embodiment illustrated, an adhesive layer 7, especially an adhesive layer 7 with a substantially constant adhesion force over the surface of the carrier 9, can be arranged on the carrier 9 in the embodiment illustrated. However, this adhesive layer 7 is only optional, since the method/substrate adapter 1 according to the invention does not necessarily require such an adhesive layer.

FIG. 2a furthermore illustrates a predetermined breaking point in the form of three-dimensional structures 13a-13n, which in the embodiment illustrated are pyramid shaped. In further embodiments, however, the three-dimensional structures may also be pyramid shaped, sphere shaped, cube shaped, torus shaped and/or cone shaped. The material recesses are formed from the spaces between adjacent three-dimensional structures 13a-13n. In the embodiment illustrated, the material recesses are arranged on the adhesive layer 7 so as to enable a controlled detachment. In embodiments not illustrated, however, the material recesses may also be arranged in any desired position in the contacting material layer in order to make possible a controlled detachment.

Figure 2B:
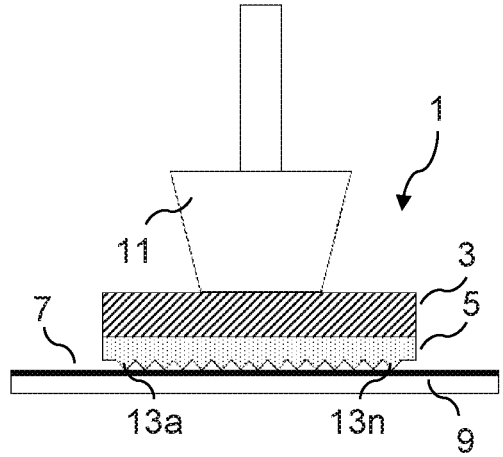
Figure 2C:
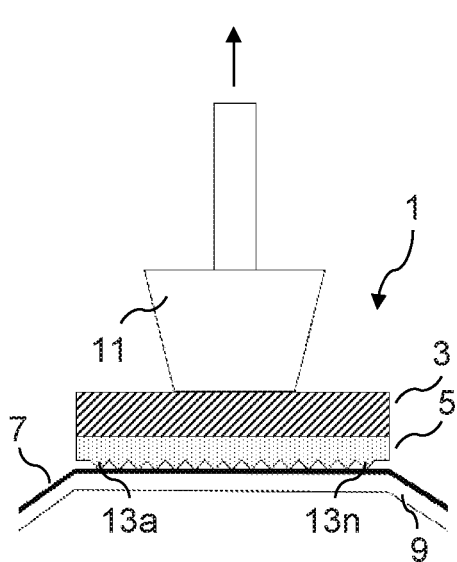
Figure 2D:
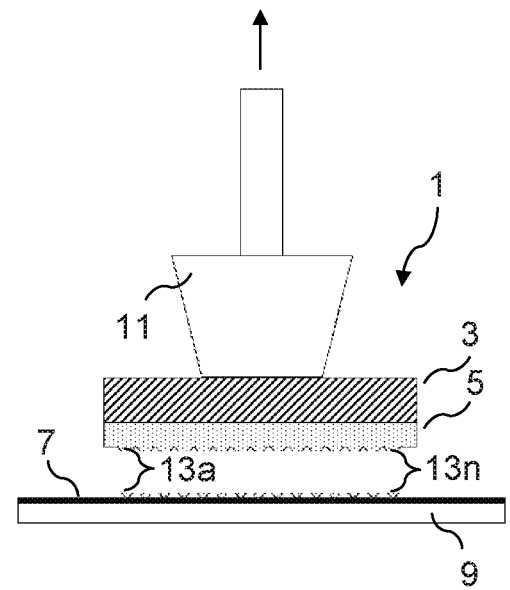

As already illustrated in FIG. 1b, also in FIG. 2b the nozzle 11 is in contact with a surface of the substrate 3 facing away from the contacting material layer 5. FIG. 2c illustrates that the substrate 3 is loosened from the carrier 9 by means of a vacuum. The arrow above the nozzle 11 illustrates the direction of movement. By lifting off and detaching the substrate 3 with the contacting material layer 5 arranged thereon, the contacting material layer 5 breaks off along the predetermined breaking point, as illustrated in FIG. 2d. In this way, uncontrolled breakage within the contacting material layer 5 during the detaching from the carrier 9 is greatly reduced or prevented. Advantageously, this can increase the production yield and the product quality of the resulting product, since no rejects are produced and no defective parts need further processing.

Figure 3A:
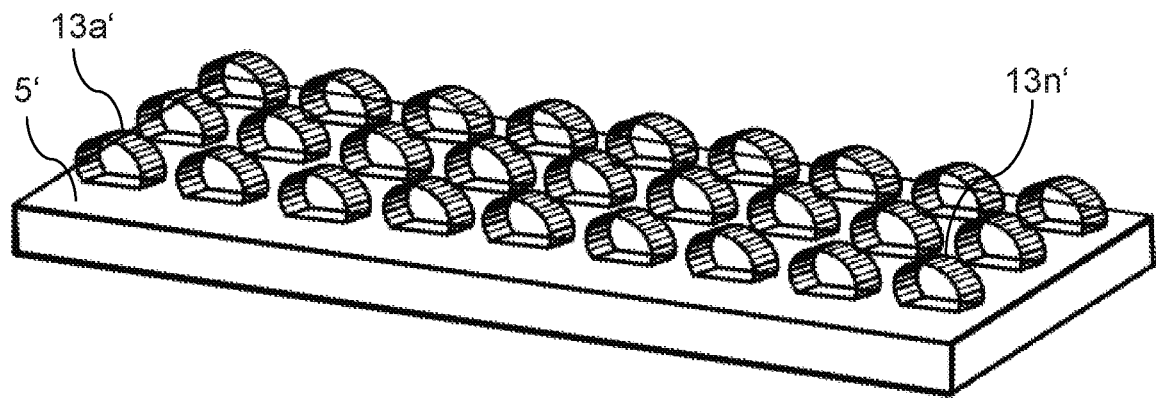
FIGS. 3a-c illustrate isometric views of three-dimensional structures according to embodiments.
Figure 3B:
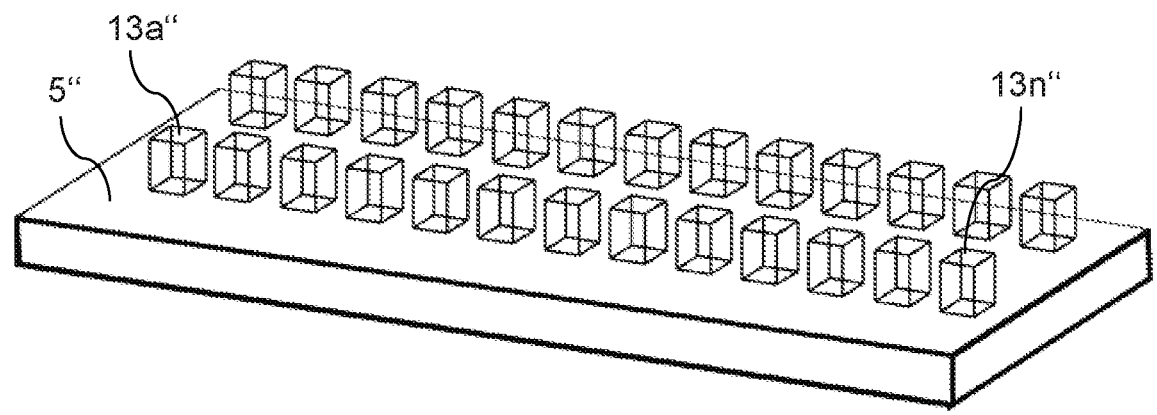
Figure 3C:
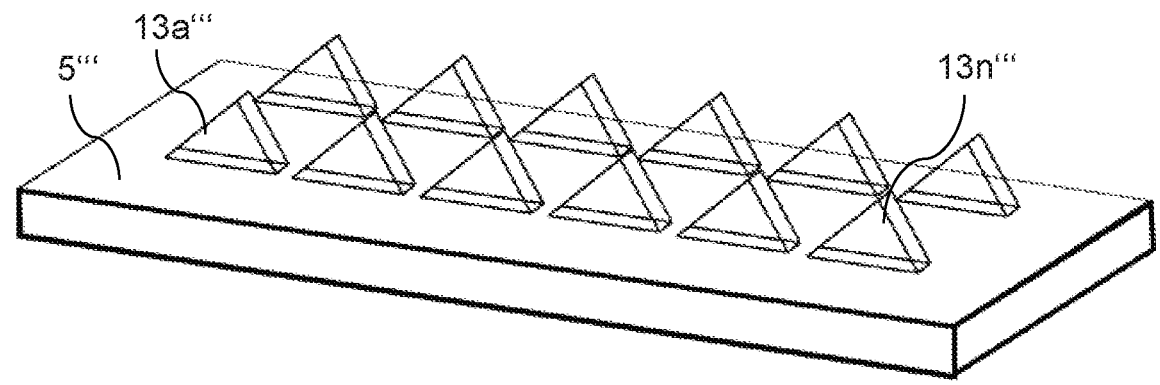

FIGS. 3a-c show isometric views of three-dimensional structures 13a'-13n', 13a"-13n", 13a'''-13n''' according to embodiments.

FIG. 3a illustrates sphere-shaped three-dimensional structures 13a'-13n' in the contacting material layer 5'. FIG. 3b illustrates cube-shaped three-dimensional structures 13a"-13n" in the contacting material layer 5". FIG. 3a illustrates pyramid-shaped three-dimensional structures 13a'''-13n''' in the contacting material layer 5'''.

In alternative embodiments, however, different shapes may also be used. Furthermore, more or fewer three-dimensional structures than are illustrated may be formed in the contacting material layer. For example, in one embodiment only two three-dimensional structures may be used in order to create only one material recess as the predetermined breaking point.

The features represented in the foregoing specification, in the claims and in the figures may be significant to one embodiment in its different embodiments either standing alone or in any given combination.

Although specific embodiments have been illustrated and described herein, it will be appreciated by those of ordinary skill in the art that a variety of alternate and/or equivalent implementations may be substituted for the specific embodiments illustrated and described without departing from the scope of the present embodiments. This application is intended to cover any adaptations or variations of the specific embodiments discussed herein. Therefore, it is intended that these embodiments be limited only by the claims and the equivalents thereof.

The invention claimed is:

1. A method for producing a substrate adapter for connecting to an electronic component, comprising:
   arranging at least one contacting material layer on a surface of a substrate and between at least one side of a carrier and the surface of the substrate such that the at least one contacting material layer has at least one predetermined breaking point;
   joining the carrier and the substrate to the at least one contacting material layer;
   wherein the carrier comprises at least one adhesive layer with a substantially constant adhesive force over the surface of the carrier; and
   wherein the at least one contacting material layer comprises at least one of a sinter material, a sinter paste, and a sinter foil;
   wherein the arranging of the at least one contacting material layer comprises arranging the at least one contacting material layer with a plurality of material recesses in the at least one contacting material layer thereby forming the at least one predetermined breaking point, wherein the plurality of material recesses are situated on a surface of the at least one contacting material layer or face toward the carrier; and
   lifting off and detaching the substrate with the contacting material layer arranged thereon, the contacting material layer breaks off along the predetermined breaking point.

2. The method according to claim 1, wherein the arranging of the at least one contacting material layer comprises arranging the at least one contacting material layer at least for a portion in the form of three-dimensional structures in a form comprising one of pyramid-shaped, sphere-shaped, cube-shaped, torus-shaped, cylinder-shaped, and cone-shaped structures, wherein the plurality of material recesses are formed of at least one space between adjacent three-dimensional structures.

3. The method according to claim 2, wherein the arranging of the at least one contacting material layer comprises evenly spaced arranging, of the three-dimensional structures along a first axis of extension and a second axis of extension, wherein the first and the second axis of extension are situated at an angle of substantially 90° to each other.

4. The method according to claim 1, wherein the arranging of the at least one contacting material layer comprises arranging the at least one contacting material layer on the carrier by pressing, comprising at least one of silk screening, spraying on, and doctor blading, or arranging the at least one contacting material layer on the carrier by embossing with a stamp or a profiled roller.

5. The method according to claim 1, wherein the at least one contacting material layer comprises at least one of an adhesive, a solder, a silver, a silver alloy, a copper, and a copper alloy.

6. The method according to claim 1, wherein the method comprises detaching the substrate adapter with a gripping or suctioning device, substantially along the at least one predetermined breaking point between the contacting material layer and the carrier.

7. The method according to claim 1, comprising separating the substrate and the carrier joined to the at least one contacting material layer after the joining of the carrier and the substrate to the at least one contacting material layer, dividing, prior to the detaching of the substrate joined to the at least one contacting material layer, into at least two with separating of shaped parts of the substrate joined to the contacting material layer, into a plurality of shaped parts by means of sawing, stamping, and/or etching.

8. The method according to claim 1, wherein the substrate comprises one of a metal element, a metal foil, and a copper foil.

9. A substrate adapter for connecting to an electronic component, comprising:
   a carrier;
   a substrate; and
   a contacting material layer comprising at least one of a sinter material, a sinter paste, and a sinter foil;
   wherein the contacting material layer is arranged on a surface of the substrate between at least one side of the carrier and the surface of the substrate;
   wherein the contacting material layer has at least one predetermined breaking point;
   wherein the carrier comprises at least one adhesive layer with a substantially constant adhesive force over the surface of the carrier;
   wherein the carrier and the substrate are joined to the contacting material layer;
   wherein the contacting material layer comprises a plurality of recesses in the contacting material layer in order to form the predetermined breaking point, the material recesses situated on a surface of the contacting material layer or facing toward the carrier; and
   wherein the at least one predetermined breaking point is configured such that lifting off and detaching the substrate causes the contacting material layer to break off along the predetermined breaking point.

10. The substrate adapter according to claim 9, wherein the contacting material layer is arranged at least for a portion in the form of three-dimensional structures comprising at least one of pyramid-shaped, sphere-shaped, cube-shaped, torus-shaped, cylinder-shaped, and cone-shaped structures, wherein the material recesses are formed of at least one space between adjacent three-dimensional structures.

11. The substrate adapter according to claim 10, wherein the three-dimensional structures are arranged, evenly spaced, along a first axis of extension and a second axis of extension, wherein the first and the second axis of extension are situated at an angle of substantially 90° to each other.

12. The substrate adapter according to claim 9, wherein the contacting material layer comprises an adhesive, a solder, a sinter foil comprising one of a silver, a silver alloy, a copper, and a copper alloy.

* * * * *